United States Patent [19]
Krajec et al.

[11] Patent Number: 6,037,788
[45] Date of Patent: *Mar. 14, 2000

[54] DOCKING STATION FOR AUTOMATED TEST FIXTURE

[75] Inventors: Russell S. Krajec, Berthoud; Peter J. Vanderheiden, Loveland, both of Colo.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/025,982

[22] Filed: Feb. 19, 1998

[51] Int. Cl.⁷ ..................................................... G01R 1/00
[52] U.S. Cl. ............................................................. 324/755
[58] Field of Search ..................... 324/754, 755

[56] References Cited

U.S. PATENT DOCUMENTS 5,216,361  6/1993  Akar et al. .............................. 324/761

*Primary Examiner*—Robert Raevis

[57] ABSTRACT

The inventive mass interface or docking station comprises several resource connections that are located in a predetermined arrangement. These connections couple with connections arranged in complementary manner on the test fixture. The resource connections provide the various electrical, power, RF, and pneumatic resources required to test the production devices. The predetermined arrangement of connections allows fixtures to be quickly changed, as all connections can be simultaneously coupled and de-coupled. Thus, the docking station interface on the test fixture is standardized, and the test machine interface on the inventive docking station is customized to the test machine.

22 Claims, 2 Drawing Sheets

DOCKING STATION FOR AUTOMATED TEST FIXTURE

TECHNICAL FIELD OF THE INVENTION

This application relates in general to automatic testing machines, and in specific to a docking station which connects the test fixture to an automatic testing machine.

BACKGROUND OF THE INVENTION

An automatic testing machine (ATM) operates in a production environment to rapidly and accurately test the operation and performance of various types of devices under test (DUT), including computer devices and communication devices. The DUTs could be a finished product or a component of a larger system.

The ATM is programmed to perform various tests on the DUT automatically. For example, a microcomputer chip DUT may be fed power and known input signals, and the output signal of the DUT compared with expected results. Another example is where RF signals are transmitted to a finished cellular telephone DUT to determine if the telephone properly operates. Other tests could include environmental tests, such as temperature or vibration tests.

Depending upon the nature and number of the tests being performed, the testing may last from a couple of milliseconds to several minutes. The information from the testing is compared with expected test results. If there is some defect such that the DUT falls below specifications, the ATM will designate the DUT as failed, either by marking the DUT, placing the DUT in a failure area, or indicating the failure to an operator.

The ATM is then loaded with the next DUT, either manually or automatically, and the testing procedure is repeated for this next DUT. This testing information from the testing can be used to evaluate the fabrication process for possible changes, as well as to perform failure analysis on individual failed devices.

Typically, each ATM is designed to perform a specific class of tests on the DUT, and are not able to perform other classes of tests. For example, a vibration ATM may not be able to perform electrical signal tests. However, different types of DUTs may require the same tests to be performed. For example, all types of microcomputer chips are tested for electronic performance characteristics, but different chips will have different locations for power, inputs and outputs. ATMs are made flexible by the use of test fixtures. The test fixture provides an interface between the device under test DUT and the ATM. Thus, a single ATM can perform tests on different types of devices when connected via different fixtures.

As shown in FIG. 3, ATM 31 is connected to DUT 32 via fixture 33. Fixture 33 is connected to ATM 31 via connections 34. For the sake of simplicity, only five connections 34 are depicted, however, depending on the nature of the DUT and the tests being performed, more or less connections 34 may be required. For example, typical connections to perform an operational test on a cellular telephone may require one high voltage connection, 8 ganged electrical connections comprising 90 electrical connections, 6 RF connections, and 36 or more pneumatic connections.

The number of connections 34 between fixture 33 and ATM 31 causes problems when fixture 33 needs to be changed. For example, fixture 33 would need to be changed when a different type of DUT 32 is going to be tested or if fixture 33 malfunctions in some manner and requires either repair or replacement. While fixture 33 is being replaced, the production line is necessarily halted. The large number of connections which first have to be removed, and then properly replaced is extremely time consuming, often requiring 10 or more minutes of production line downtime.

Moreover, if the connections are improperly made, then incorrect information about DUT 32 may be collected. The incorrect information could lead to improperly passing a defective DUT or failing a passing DUT. The incorrect information may also result in incorrect or unnecessary changes being made to the production process. Also if the connections are improperly made, then damage may occur to the DUT. For example, incorrectly connecting a power supply to a data input may destroy the computer microchip of the DUT. Furthermore, the connectors on the ends of connections 34 are typical fragile, and thus can easily be damaged during fixture 33 replacement, particularly if the connector is incorrectly oriented during insertion. However, the connectors are also susceptible to damage from normal wear and tear incurred during fixture replacement. This is due to the slight misalignment that occurs when operators manually plug and unplug connectors from fixture 33.

Other problems that could arise because of connections 34 include cross-talk, cross-coupling, or other forms of mutual interference. This would occur when critical lines of connections 34 are positioned too close to each other. This could cause the collection of incorrect information about DUT 32. The incorrect information could lead to improperly passing a defective DUT or failing a passing DUT. The incorrect information may also result in incorrect or unnecessary changes being made to the production process. For example, an input signal is crossed onto a second input line, which causes a different output than is expected, and thus the passing DUT is failed.

Therefore, there is a need in the art for an apparatus and method that allows for the rapid and reliable replacement of ATM fixtures in a production environment with a low potential for connector damage.

SUMMARY OF THE INVENTION

These and other objects, features and technical advantages are achieved by a system and method which uses a mass interface that permits the rapid and reliable replacement of ATM fixtures. The inventive mass interface or docking station provides the test fixture with all electrical connections, RF connections, pneumatic connections, and other resources connections such as chemicals or water, that are necessary resources for the operation of the test fixture.

The inventive docking station comprises connections that are located in a predetermined arrangement which couple with complementary connections positioned on the test fixture. Thus, to change fixtures, the current fixture is de-coupled, and the next fixture is coupled to the inventive docking station. The predetermined arrangement allows for all of the connections to be substantially simultaneously coupled or de-coupled. Consequently, the docking station interface on the test fixture is standardized, thus allowing the test fixtures to be manufactured as a standard part. The ATM interface on the inventive docking station is customized to the test machine.

A technical advantage of the present invention is reduced downtime of the production line to remove and replace a test fixture.

Another technical advantage of the present invention is that the connections are pre-positioned and cannot be improperly attached.

A further technical advantage of the present invention is that the docking station interface on the test fixture is standardized.

A further technical advantage of the present invention is that the connectors are pre-aligned and incur a lower amount of damage during installation.

A further technical advantage of the present invention is that cross-talk between the connections is minimized.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
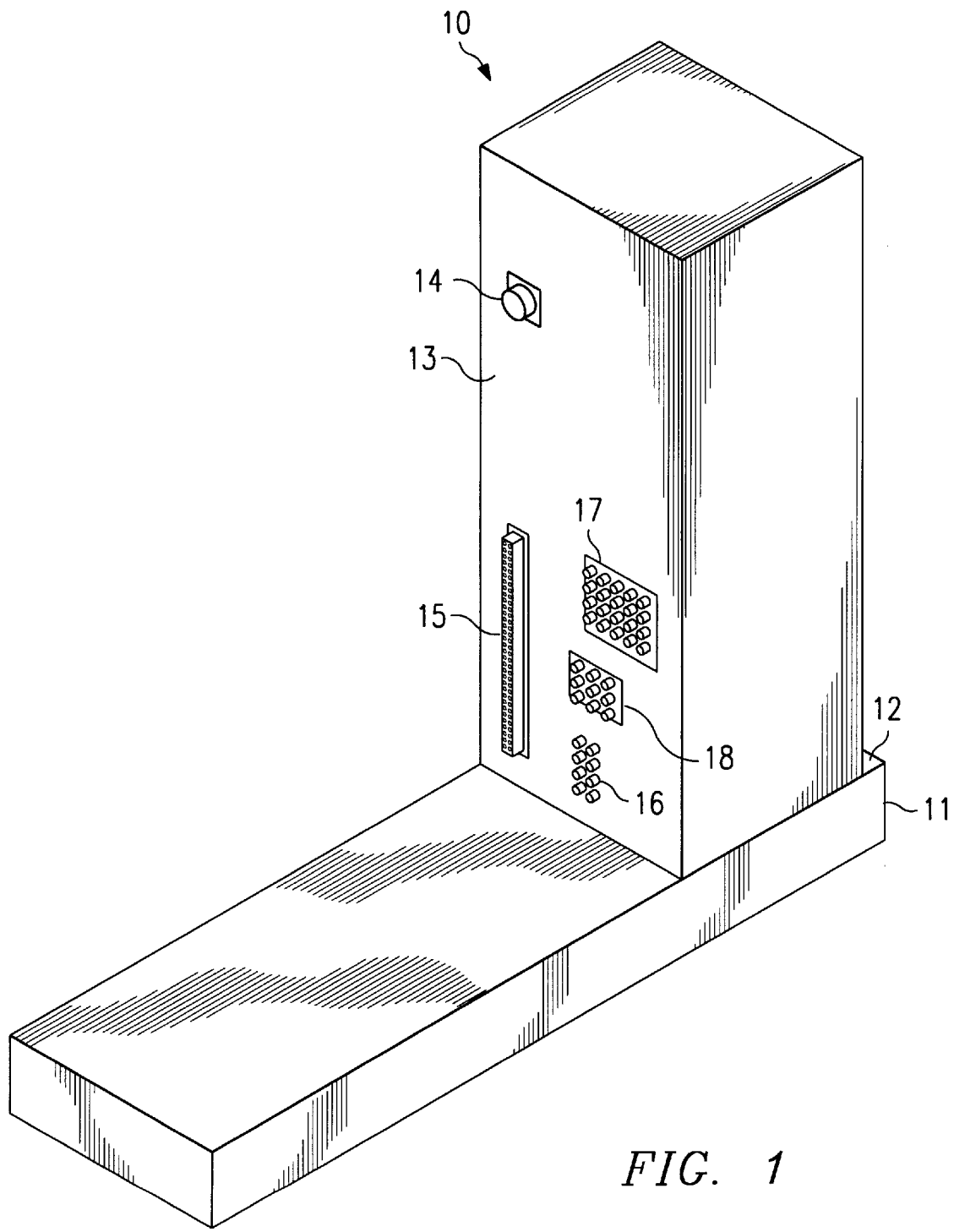
FIG. 1 depicts the inventive docking station coupled to an automatic testing machine.

FIG. 1 depicts the inventive docking station 10 coupled to an automatic testing machine (ATM) 11. ATM interface 12 of docking station is customized to couple to ATM 11. ATM interface 12 would comprise a predetermined arrangement of connection locations similar to that of fixture interface 13. Alternatively, ATM interface 12 could comprise a plurality of lead, wire, pipe, or conduit connections, which are coupled to appropriate connection points on ATM 11. ATM interface 12 could be removably attached to ATM 11 via quick disconnects, snap connectors, or quarter turn connectors. Alternatively, ATM interface 12 could be fixedly attached to ATM 11 via screws, rivets, or adhesives.

Figure 2:
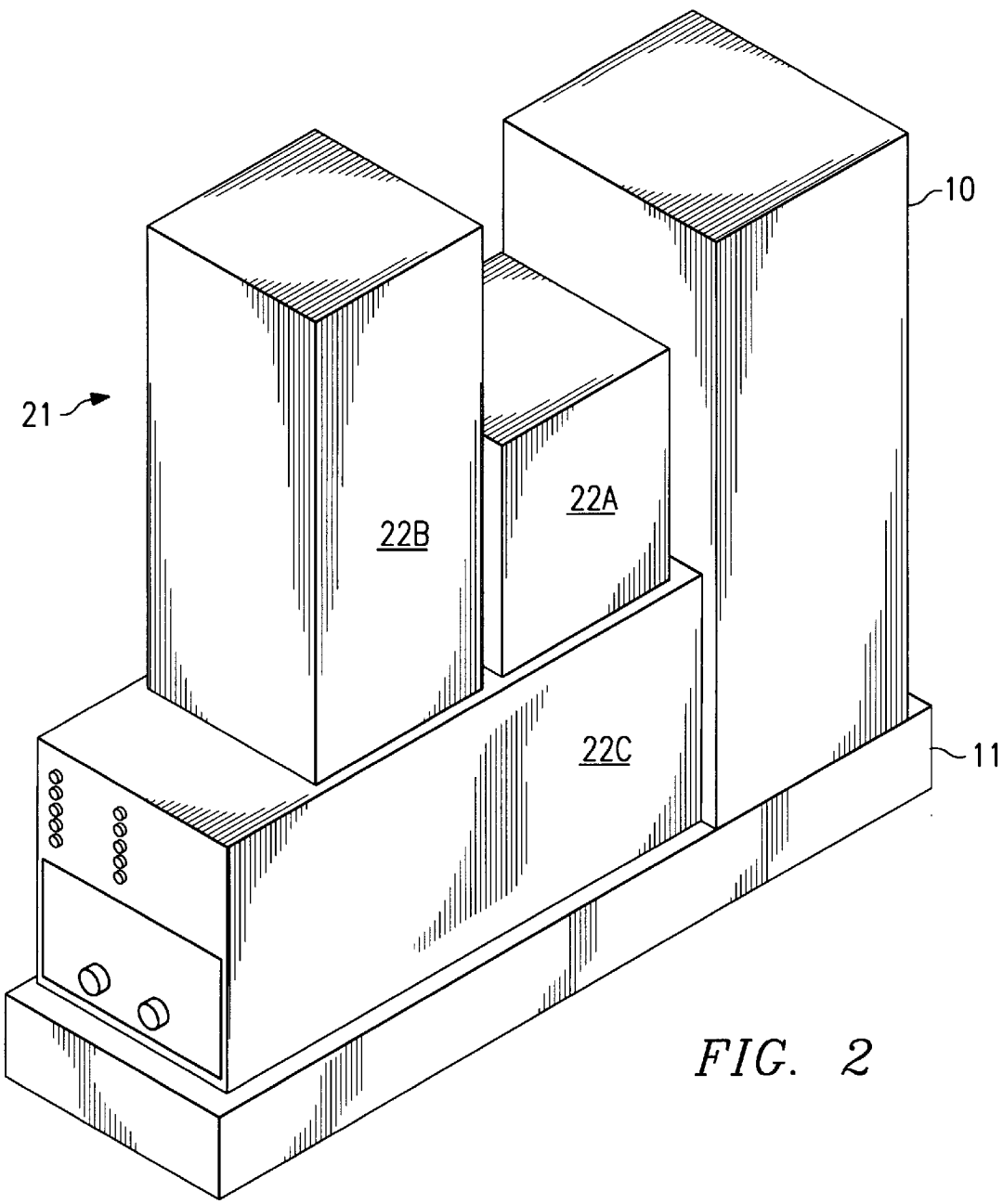
FIG. 2 depicts the inventive docking station of FIG. 1 coupled to a fixture having sub-components.
Figure 3:
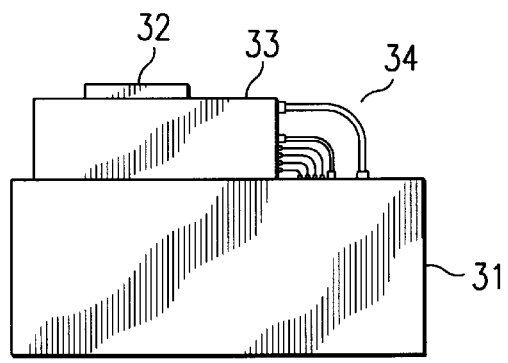
FIG. 3 depicts a prior art arrangement of a fixture coupled to an automatic testing machine.

Fixture interface 13 of docking station 10 couples to one or more fixtures (such as 22A, 22B, 22C shown in FIG. 2). The DUT (not shown) is tested inside of one of the fixtures shown in FIG. 2. The engagement mechanism of the connectors used on the fixture interface allow for a quick connect to and disconnect from the fixture. The connectors are sliding connectors, such that connections between docking station 10 and fixture are made by sliding the fixture into the docking station, without any turning or other locking mechanism. However, a locking mechanism can be incorporated into docking station 10 if the resources are hazardous resources, e.g. hazard chemicals or very high voltage electricity. Separation of the connections between the docking station and the fixture is achieved by sliding the fixture away from the docking station.

Fixture interface 12 comprises a predetermined arrangement of connection locations such that the fixture is provided with the necessary power, signals, and other resources needed for the testing of the DUT. By way of example only, fixture interface 12 is shown to include a high voltage power connection 14, electrical connections 15, RF connections 16, pneumatic connections 17, and other resource connections 18 such as chemical or water in any of liquid, gas, vapor, or mist forms. The precise resource composition of fixture interface 12 would vary according to the type of ATM 11, the type of DUT, and the testing being performed.

Similarly, the physical arrangement of connections shown in FIG. 1 is by way of example only. However, the location of each of the connections must coincide with the location of a corresponding connection on the fixture. Thus, the fixtures that would be used on this ATM 11 with this docking station 10 would have a corresponding interface that would couple to interface 13. Any fixture with the corresponding interface could be connected to interface 13. Consequently, the fixtures have a standard interface which would allow the fixtures to be manufactured as standard parts. FIG. 2 depicts docking station 10 coupled to fixture 21 having sub-components 22A, 22B, and 22C. However, fixture 21 could comprise a single component.

Further standardization of the fixtures can be accomplished by using the same arrangement of interface 13 for substantially all types of ATMs. The connections made at ATM interface 12 would depend on the type of ATM. For example, if no chemicals resources are required, then the chemical connections at ATM interface 12, which correspond to connections 18, would not be connected to ATM 11. Any such un-used connections could be sealed off with a plug or cover at the ATM interface. However, connections 18 would still appear at fixture interface 13. Similarly, a corresponding connection would be present on the fixture, but would not be used during testing since no chemicals would be supplied.

To change fixtures, the current fixture is removed by de-coupling the connections and pulling out the current fixture. The fixture is supported by a surface on either the ATM or the docking station. The surface allows the fixture to be aligned and connected to the docking station by sliding the fixture. Thus, the next fixture is attached to docking station 10 by aligning the fixture to docking station 10, and pushing in the fixture, such that the connection points of the fixture couple to the corresponding connection points of interface 13. Note that since all of the connections are made or separated substantially simultaneously, the number of connections does not effect installation time. Thus, fixtures can be rapidly changed if a different type of DUT is going to be tested or if the fixture needs to be repaired. Since the installation time is low, i.e. less than one minute, then losses from production downtime are reduced. Note that as shown in FIG. 2, fixture 21 may comprise several sub-components 22A, 22B, and 22C which may complicate the removal process. For example, to replace component 22C with a different component, components 22A and 22B will have to be removed and then re-inserted after component 22C is installed. If the fixture comprises several sub-components, then the connections for each sub-component are made substantially simultaneously.

Since the connection points are predetermined, then connections to the fixtures cannot be improperly made, and any errors, such as incorrect information or damage to the DUT, which would have arisen from improper connection are avoided. The connectors are properly oriented, and thus damage that would have occurred to the connectors from attempted installation of improperly oriented connectors is avoided. Furthermore, the connectors on interface 13 are subject to less wear and damage because the connectors are pre-aligned. Thus, the wear or damage that would occur from the slight misalignment caused by the operator during installation would not occur or be greatly reduced. Therefore, the connecters are less susceptible to damage from normal wear and tear incurred during fixture replacement.

Docking station 10 could optionally incorporate shielding, such as a gaussian surface, or a dielectric material, such as an insulator, to isolate the connections from each other, and thus prevent cross-talk, cross-coupling, or other forms of mutual interference. For example, cross-talk among the different RF connections 16 can be minimized by using shielding or insulation within docking station 10. Thus, any errors which would have arisen from cross-talk are avoided.

Although the present invention and its advantages have been described in detail, it should be understood that various changes, substitutions and alterations can be made herein without departing from the spirit and scope of the invention as defined by the appended claims.

What is claimed is:

1. An interface mechanism that enables transfer of resources to a fixture from an automatic testing machine, wherein the fixture supports a device to be tested and the resources are used in testing the device, and the fixture is selected from a plurality of fixtures, the interface mechanism comprising:
    a first interface region for joining with the automatic testing machine and receiving the resources from the automatic testing machine; and
    a second interface region for joining with the fixture and providing the resources to the fixture;
    wherein the second interface region includes a plurality of connection points located in a predetermined arrangement for coupling with corresponding points of the fixture;
    each fixture of the plurality of fixtures has a complementary interface region including a plurality of connection points located in a common predetermined arrangement that couple with corresponding points of the second interface region; and
    the fixture has a device interface region arranged to couple to the device, wherein another fixture of the plurality of fixtures has a different device interface region to couple to another device.

2. The interface mechanism of claim 1, wherein:
    the resources are transferred to the interface mechanism from the automatic testing machine through the first interface region via a plurality of connections; and
    wherein each connection is selected from a group consisting of a lead, a wire, a pipe, and a conduit.

3. The interface mechanism of claim 1, wherein the resources are selected from a group consisting of:
    power, electrical signal, RF signal, air, and chemical.

4. The interface mechanism of claim 1, further comprising:
    means for isolating the resources from each other during throughput of the resources from the first interface region to the second interface region.

5. The interface mechanism of claim 1, wherein:
    the second interface region receives testing information from the fixture and the first interface provides the testing information to the automatic testing machine.

6. The interface mechanism of claim 5, wherein:
    the testing information is used by the automatic testing machine to determine whether the device passes testing.

7. A method for replacing a first fixture of an automatic testing machine with a second fixture, wherein the first fixture is coupled to the automatic testing machine via an interface mechanism that enables transfer of resources to the first fixture from the automatic testing machine, the first fixture supports a device to be tested, and the resources are used in testing the device, the method comprises the steps of:
    removing the first fixture by de-coupling, substantially simultaneously, a plurality of connection points of the interface mechanism which provide the resources to the first fixture; and
    installing the second fixture by coupling, substantially simultaneously, the plurality of connection points to provide the resources to the second fixture;
    wherein the plurality of connection points are located in a predetermined arrangement;
    both fixtures have a complementary plurality of connection points located in a common predetermined arrangement that couple with corresponding points of the interface mechanism; and
    the first fixture has a device interface region arranged to couple to the device, and the second fixture has a different device interface region to couple to another device.

8. The method of claim 7, wherein the resources are selected from a group consisting of:
    power, electrical signal, RF signal, air, and chemical.

9. The method of claim 7, wherein:
    the resources are transferred to the interface mechanism from the automatic testing machine via a plurality of connections; and
    wherein each connection is selected from a group consisting of a lead, a wire, a pipe, and a conduit.

10. An automatic testing machine for testing a device, wherein the automatic testing machine includes a docking station that enables transfer of resources that are used in testing the device to a fixture that supports the device, and the fixture is selected from a plurality of fixtures, the automatic testing machine comprising:
    an interface surface that is oriented in a first direction for joining with the fixture and providing the resources to the fixture, the interface surface is located on the docking station and includes a plurality of connection points located in a predetermined arrangement for coupling with corresponding points of the fixture; and
    a support surface that is oriented in a second direction that is orthogonal to the first direction for supporting the fixture while connected to the automatic testing machine;
    wherein each fixture of the plurality of fixtures has a fixture interface surface that includes a plurality of connection points located in a common predetermined arrangement that couple with corresponding points of the interface surface; and
    the fixture has a device interface region arranged to couple to the device, wherein another fixture of the plurality of fixtures has a different device interface region to couple to another device.

11. The automatic testing machine of claim 10, wherein:
    the support surface facilities coupling of the fixture to the docking station.

12. The automatic testing machine of claim 10, wherein:
    the support surface facilities decoupling of the fixture to the docking station.

13. The automatic testing machine of claim 10, wherein:

the docking station is fixedly attached to the automatic testing machine.

14. The automatic testing machine of claim 10, wherein:

the docking station is removably attached to the automatic testing machine.

15. The automatic testing machine of claim 10, wherein the resources are selected from a group consisting of:

power, electrical signal, RF signal, air, and chemical.

16. The automatic testing machine of claim 10, wherein:

wherein the predetermined arrangement of the interface surface and the predetermined arrangement of the fixture interface surface are standardized arrangements.

17. The automatic testing machine of claim 10, wherein the docking station comprises:

an automatic testing machine interface for joining with the automatic testing machine and receiving the resources from the automatic testing machine.

18. The automatic testing machine of claim 17, wherein the docking station further comprises:

means for isolating the resources from each other during throughput of the resources from the automatic machine interface to the interface surface.

19. The automatic testing machine of claim 10, wherein:

the interface surface receives testing information from the fixture and provides the testing information to the automatic testing machine.

20. The automatic testing machine of claim 19, wherein:

the testing information is used by the automatic testing machine to determine whether the device passes testing.

21. The automatic testing machine of claim 10, wherein:

the first direction is a vertical direction; and the second direction is a horizontal direction.

22. The automatic testing machine of claim 10, wherein:

the resources are transferred to the docking station from the automatic testing machine via a plurality of connections; and wherein each connection is selected from a group consisting of a lead, a wire, a pipe, and a conduit.

* * * * *